US009604852B2

(12) United States Patent
Yuan et al.

(10) Patent No.: US 9,604,852 B2
(45) Date of Patent: Mar. 28, 2017

(54) α-ALUMINA PARTICLES AND METHOD FOR MANUFACTURING THE SAME

(71) Applicant: DIC Corporation, Tokyo (JP)

(72) Inventors: Jianjun Yuan, Sakura (JP); Hiroshi Kinoshita, Sakura (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 14/431,891

(22) PCT Filed: Sep. 27, 2013

(86) PCT No.: PCT/JP2013/076369
§ 371 (c)(1),
(2) Date: Mar. 27, 2015

(87) PCT Pub. No.: WO2014/051091
PCT Pub. Date: Apr. 3, 2014

(65) Prior Publication Data
US 2015/0239746 A1  Aug. 27, 2015

(30) Foreign Application Priority Data

Sep. 28, 2012 (JP) ................ 2012-216517

(51) Int. Cl.
*C30B 29/00* (2006.01)
*C01F 7/02* (2006.01)
(Continued)

(52) U.S. Cl.
CPC .................. *C01F 7/02* (2013.01); *C01F 7/30* (2013.01); *C01F 7/306* (2013.01); *C01F 7/32* (2013.01);
(Continued)

(58) Field of Classification Search
CPC ........ C01F 7/02; C01F 7/441; C01P 2004/41; C01P 2004/61; C01P 2004/80
(Continued)

(56) References Cited

U.S. PATENT DOCUMENTS

| 4,487,756 A | 12/1984 | Mizrah et al. |
| 5,296,085 A | 3/1994 | Faure et al. |

(Continued)

FOREIGN PATENT DOCUMENTS

| CN | 1095360 A | 11/1994 |
| JP | 59-097528 A | 6/1984 |

(Continued)

OTHER PUBLICATIONS

Shuji Oishi et al., "Flux Growth of Hexagonal Bipyramidal Ruby Crystals," J. Am. Chem. Soc., 2004, 126, pp. 4768-4769.
(Continued)

*Primary Examiner* — Holly Le
(74) *Attorney, Agent, or Firm* — Locke Lord LLP

(57) ABSTRACT

The present invention aims to provide a simple and efficient method for manufacturing α-alumina particles, main component particles of which each have a crystal face other than the face [001] as a main crystal face and a polyhedral shape other than a hexagonal bipyramidal shape. According to the method for manufacturing α-alumina particles of the present invention, when an aluminum compound is calcined in the presence of a specific content of a metal compound, α-alumina particles each having a particle diameter of 50 μm or less, a degree of α crystallization of 90% or more, and a polyhedral shape can be obtained.

12 Claims, 4 Drawing Sheets

(51) Int. Cl.
*C30B 29/20* (2006.01)
*C01F 7/30* (2006.01)
*C01F 7/32* (2006.01)
*C01F 7/44* (2006.01)

(52) U.S. Cl.
CPC .............. *C01F 7/442* (2013.01); *C30B 29/20* (2013.01); *C01P 2002/72* (2013.01); *C01P 2002/86* (2013.01); *C01P 2004/03* (2013.01); *C01P 2004/30* (2013.01); *C01P 2004/41* (2013.01); *C01P 2004/61* (2013.01); *C01P 2006/12* (2013.01); *C01P 2006/80* (2013.01); *Y10T 428/2982* (2015.01)

(58) Field of Classification Search
USPC ........................... 428/402; 423/266, 275, 625
See application file for complete search history.

(56) References Cited

U.S. PATENT DOCUMENTS

| | | | |
|---|---|---|---|
| 5,538,709 A | 7/1996 | Mohri et al. | |
| 5,935,550 A | 8/1999 | Mohri et al. | |
| 6,159,441 A | 12/2000 | Mohri et al. | |
| 6,165,437 A | 12/2000 | Mohri et al. | |
| 6,524,549 B1 * | 2/2003 | Mohri | C01F 7/02 423/625 |
| 2004/0240062 A1 * | 12/2004 | Lortz | B82Y 30/00 359/566 |
| 2007/0098618 A1 | 5/2007 | Teshima et al. | |
| 2011/0277680 A1 | 11/2011 | Teshima et al. | |
| 2012/0237439 A1 * | 9/2012 | Rouleau | B01J 29/0308 423/628 |

FOREIGN PATENT DOCUMENTS

| | | |
|---|---|---|
| JP | 03-131517 A | 6/1991 |
| JP | 06-191836 A | 7/1994 |
| JP | 07-187663 A | 7/1995 |
| JP | 07-206430 A | 8/1995 |
| JP | 11-138423 A | 5/1999 |
| JP | 2008-127257 A | 6/2008 |
| WO | WO-2005/054550 A1 | 6/2005 |

OTHER PUBLICATIONS

Yoshio Uchida et al., "Advanced Development of Advanced Alumina 'Sumicorunduma®'," Sumitomo Chemical Co., Ltd., 2000-I, pp. 45-49.
Office Action mailed May 13, 2014, issued for the Japanese patent application No. 2014-502280.
Office Action mailed Nov. 4, 2015, issued for the Chinese patent application No. 201380050921.2.
International Search Report mailed Oct. 22, 2013, issued for PCT/JP2013/076369.
Office Action mailed May 13, 2014, issued for the Japanese patent application No. 2014-502280 and English translation thereof.
Office Action mailed Nov. 4, 2015, issued for the Chinese patent application No. 201380050921.2 and English translation thereof.

* cited by examiner

α-ALUMINA PARTICLES AND METHOD FOR MANUFACTURING THE SAME

TECHNICAL FIELD

The present invention relates to a method for manufacturing approximately spherical α-alumina particles having uniform particle shapes, the α-alumina particles being obtained by calcining an aluminum compound which is used as a precursor in the presence of a metal compound, such as a molybdenum compound and/or a vanadium compound, and the present invention also relates to polyhedral α-alumina particles obtained by the method described above.

BACKGROUND ART

Since being excellent in mechanical strengths, such as abrasion resistance, chemical stability, thermal conductivity, heat resistance, and the like, alumina has many application fields and has been widely used in the fields of abrasives, electronic materials, heat dissipation fillers, optical materials, biomaterials, and the like. In particular, for the filler application, there has been demanded alumina with the high degree of α crystallization which has high chemical and physical stability and having an approximately spherical shape which hardly abrades an apparatus or the like. Furthermore, in the application in which a heat dissipation property of alumina is expected, in order to realize high filling of high thermal conductive alumina having a high degree of α crystallization in resin, alumina particles each having an approximately spherical shape have been demanded.

A general and most inexpensive method for manufacturing α-alumina is Bayer's method which uses bauxite as a raw material. According to Bayer's method, aluminum hydroxide (gibbsite) or transition alumina is manufactured from bauxite as a raw material, followed by performing calcination in the air, so that an α-alumina powder is manufactured. However, α-alumina obtained by Bayer's method is aggregates of shapeless particles, and hence, the particle shape and the particle diameter thereof are difficult to control.

Because of the background as described above, attention has been paid to an alumina synthesis which can form α crystal and which can control the particle shape and the particle diameter thereof. For example, there has been disclosed a method for manufacturing hexagonal plate-shaped α-alumina having an average particle diameter of 2 to 20 μm and a well-developed face [001] in which after a fluorine-based flux having a melting point of 800° C. or less is added as a mineralizer to aluminum hydroxide or transition alumina, calcination is performed at a high temperature (for example, see Patent Literature 1). However, by this method, since all the particle shapes are hexagonal plates, the problems in that an excellent abradability and a high filling property in resin are difficult to obtain may arise.

In order to synthesize polyhedral α-alumina particles each having an approximately spherical shape, a plurality of proposals has been made in the past. For example, there has been disclosed a method for manufacturing an α-alumina powder having an average particle diameter of 1 to 10 μm and a ratio (D/H ratio) of approximately 1, the ratio being a ratio of a diameter D orthogonal to the crystallographic C axis to a height H parallel thereto, in which boron and a boron-based compound, each containing ammonium, are used as a mineralizer, and aluminum hydroxide (gibbsite) obtained by Bayer's method is calcined at 1,200° C. or more (for example, see Patent Literature 2). In addition, there has been disclosed a method for manufacturing polyhedral α-alumina single crystal particles having an average particle diameter 0.1 to 30 μm and a D/H ratio in a range of 0.5 to 3 in which by the use of a halogen gas, transition alumina and/or an alumina raw material to be formed into transition alumina by a heat treatment is calcined at 1,100° C. (for example, see Patent Literature 3). Furthermore, there has been disclosed a method for manufacturing polyhedral α-alumina particles having an average particle diameter 0.5 to 6 μm and a D/H ratio in a range of 1 to 3 in which a mixture obtained by addition of a small amount of a fluorine compound or a small amount of a fluorine compound and a boron compound to an alumina raw material is calcined at a high temperature of 1,100° C. or more (for example, see Patent Literature 4). However, by any one of the methods disclosed in those patent literatures, in the manufacturing of polyhedral α-alumina particles, the crystal growth of the face [001] cannot be significantly suppressed, and the formation of particles each having an approximately spherical shape are difficult from theoretical and experimental points of views.

In order to completely suppress the growth of the face [001] of a polyhedral α-alumina crystal, the formation of a hexagonal bipyramidal ruby crystal only having the face [113] has been reported in which by the use of molybdenum oxide ($MoO_3$) as a flux agent, calcination is performed at a high temperature (for example, see Non-Patent Literature 1). According to the above Non-Patent Literature 1, since molybdenum oxide is selectively adsorbed to the face [113] of the ruby crystal, crystal components are not likely to be supplied to the face [113], and as a result, the appearance of the face [001] can be completely suppressed. In addition, Patent Literature 5 has disclosed a method for manufacturing a hexagonal bipyramidal artificial corundum crystal having a particle diameter of 1 to 3 mm in which a mixture of molybdenum oxide, alumina, and another auxiliary agent (95% of molybdenum oxide is contained) is calcined at 1,100° C.

However, by the methods described above, polyhedral α-alumina particles each having an approximately spherical shape and a particle diameter of 100 μm or less, which are to be used as abrasives and resin fillers in various fields, are still difficult to manufacture. In addition, since a large amount of molybdenum oxide is used as a flux agent, the problems of environment and cost may arise in some cases. By the present α-alumina synthetic techniques, α-alumina particles, main component particles of which each have a crystal face other than the face [001] as a main crystal face and a polyhedral shape other than a hexagonal bipyramidal shape, has not been synthesized.

CITATION LIST

Patent Literature

PTL 1: Japanese Unexamined Patent Application Publication No. 3-131517

PTL 2: Japanese Unexamined Patent Application Publication No. 59-97528

PTL 3: Japanese Unexamined Patent Application Publication No. 7-187663

PTL 4: Japanese Unexamined Patent Application Publication No. 2008-127257

PTL 5: WO2005/054550

Non-Patent Literature

NPL 1: Oishi et al., J. Am. Chem. Soc., 2004, 126, 4768 to 4769

SUMMARY OF INVENTION

Technical Problem

In consideration of the above circumstances, an object to be achieved by the present invention is to provided alumina particles each having an approximately spherical shape, which have not been provided in the past, and, in more particular, a simple and efficient method for manufacturing α-alumina particles, main component particles of which each have a crystal face other than the face [001] as a main crystal face and a polyhedral shape other than a hexagonal bipyramidal shape.

Solution to Problem

Through intensive research carried out by the present inventors to achieve the above object, it was found that when an aluminum compound is used as a precursor, and this precursor is calcined in the presence of a metal compound, such as a molybdenum compound and/or a vanadium compound, the metal compound interacts with the aluminum compound to form polyhedral α-alumina particles each having an approximately spherical shape at a relatively low temperature, and in addition, a metal oxide formed by calcination of the metal compound, such as a molybdenum compound and/or a vanadium compound, can be removed by sublimation. Accordingly, the present invention was made.

That is, the present invention provides α-alumina particles, each of which has a particle diameter of 50 μm or less, a degree of α crystallization of 90% or more, and a polyhedral shape having a crystal face other than the face [001] as the main crystal face and being other than a hexagonal bipyramidal shape, and a method for manufacturing polyhedral α-alumina particles by calcining an aluminum compound in the presence of a metal compound. According to the present invention, there are provided a manufacturing method in which a molar ratio of aluminum in the aluminum compound to a metal in the metal compound is set so that aluminum/metal is 0.03 to 3.0 and, in particular, a method for manufacturing polyhedral α-alumina microparticles in which a maximum temperature during the calcination is 900° C. to 1,300° C., an increase in temperature to the maximum temperature is performed in a range of 1 to 10 hours, and furthermore, holding at a calcination temperature is performed for a holding time in a range of 5 minutes to 5 hours.

Advantageous Effects of Invention

The α-alumina particles of the present invention are obtained by calcining an arbitrary-shaped aluminum compound used as a precursor in the presence of a metal compound, such as a molybdenum compound and/or a vanadium compound, and are polyhedral α-alumina particles each having a uniform particle diameter and a crystal face other than the face [001] as the main crystal face. When a mixing ratio between the aluminum compound used as a precursor and the metal compound, such as a molybdenum compound and/or a vanadium compound; the type of metal compound; the calcination temperature; the calcination time; the specific surface area, particle diameter, and shape of the aluminum compound used as a precursor; and the like are adjusted, the shape and the particle diameter of polyhedral α-alumina particles to be obtained can be controlled. Furthermore, since a polyhedral alumina crystal having a degree of α crystallization of 100% can be obtained, and the crystal face other than the face [001] is developed, particles each having an approximately spherical shape are obtained. Hence, besides application for resin fillers and abrasives, the α-alumina particles of the present invention may also be broadly applied to various industrial fields of catalysts, photonics materials, and the like. In addition, since the manufacturing method of the present invention is performed by a simple step of only calcining at least two types of solid powders in combination without performing discharge of solvents and waste liquids, installing expensive facilities, performing complicated processes and post treatments, and the like, the manufacturing method of the present invention is a simple method without causing any environmental load.

DESCRIPTION OF EMBODIMENTS

Figure 1:
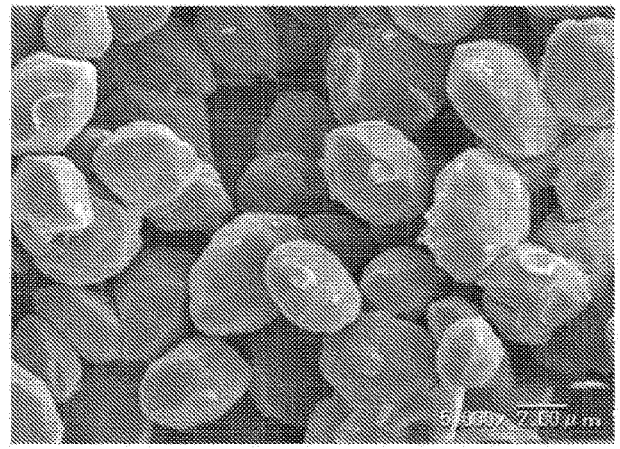
FIG. 1 is a scanning electron microscope photo of α-alumina particles obtained in Example 1.

The crystal structure of α-alumina is a close-packed hexagonal lattice structure, and the most stable crystal structure in view of thermodynamics is a plate shape in which the face [001] is developed. An industrial or a laboratory method for manufacturing α-alumina performed in the past is a method for manufacturing a plate-shaped alumina or a polyhedral alumina having the face [001] as a main crystal face. Hence, according to the manufacturing methods in the past, it has been impossible to manufacture α-alumina particles each having a crystal face other than the face [001] as the main crystal face, a particle diameter of 50 μm or less, a degree of α crystallization of 100%, and an approximately spherical shape. According to the present invention, since calcination of an inexpensive aluminum compound used as a precursor raw material is performed in the presence of a metal compound, such as a molybdenum compound and/or a vanadium compound, the metal compound, such as a molybdenum compound and/or a vanadium compound, is selectively adsorbed to the face [113] of α-alumina, crystal components are not likely to be supplied to the face [113], and the face [001] is suppressed from being developed, and in addition, a small amount of the metal compound, such as a molybdenum compound and/or a vanadium compound, functions as a catalyst at a relatively low temperature. Hence, it was found that α-alumina particles each having a crystal face other than the face [001] as the main crystal face, a particle diameter of 50 μm or less, a high degree of a crystallization, and an approximately spherical shape can be manufactured. In addition, in the α-alumina particles of the present invention, a small amount of a metal oxide, such as molybdenum oxide or vanadium oxide, derived from the metal compound, which cannot be sublimated, may remain on the surface and/or the inner of the alumina particles.

[Aluminum Compound]

As an aluminum compound (hereinafter referred to as a "precursor" in some cases) used as a raw material in the present invention, any material may be used as long as being formed into alumina by a heat treatment, and for example, aluminum chloride, aluminum sulfate, basic aluminum acetate, aluminum hydroxide, pseudoboehmite, transition alumina (γ-alumina, δ-alumina, θ-alumina, or the like), α-alumina, and a mixed alumina containing at least two types of crystal phases may be used. The physical forms, such as the shape, the particle diameter, and the specific surface area, of the aluminum compound used as a precursor are not particularly limited.

Since the shape after calcination is hardly reflected by the shape of the aluminum compound used as a precursor, any shape, such as a sphere, a shapeless, a structural body having aspects (such as a wire, a fiber, a ribbon, a tube, or the like), or a sheet, may be preferably used.

Since the particle diameter is also hardly reflected by the particle diameter of the aluminum compound used as a precursor as in the case described above, a solid of an aluminum compound having a particle diameter of several nanometers to several hundreds of micrometers may be preferably used.

The specific surface area of the precursor aluminum compound is also not particularly limited. As the specific surface area is increased, a large amount of a molybdenum compound and/or a vanadium compound is preferably used in view of the yield; however, when the amount of a molybdenum compound and/or a vanadium compound to be used are adjusted, an aluminum compound having any specific surface area can be used as a raw material.

In addition, the precursor aluminum compound may be formed from only an aluminum compound or a composite containing an aluminum compound and an organic compound. For example, an organic/inorganic composite obtained by modifying alumina with an organic silane and an aluminum compound composite in which a polymer is adsorbed may also be preferably used. When those composites are used, although the content of the organic compound is not particularly limited, since approximately spherical α-alumina particles can be efficiently manufactured, the content is preferably 60 percent by mass or less and more preferably 30 percent by mass or less.

[Metal Compound]

In the present invention, in order to obtain approximately spherical α-alumina particles, it is necessary to suppress the development of the face [001], and as a compound having a function therefor, a metal compound is necessarily used. In addition, since having a particularly preferable function, a molybdenum compound and/or a vanadium compound is preferably used.

As the molybdenum compound, either molybdenum oxide or a compound containing an oxoanion ($MO_x^{n-}$; hereinafter, M represents a metal) formed of a molybdenum metal and oxygen bonded thereto may be used. As is the case described above, as the vanadium compound, either vanadium oxide or a compound containing an oxoanion ($MO_x^{n-}$) formed of a vanadium metal and oxygen bonded thereto may be used.

As the compound containing an oxoanion ($MO_x^{n-}$) formed of a molybdenum metal and oxygen bonded thereto, any compound may be used as long as being converted into molybdenum oxide by high-temperature calcination. For example, molybdenum acid, $H_3PMo_{12}O_{40}$, $H_3SiMo_{12}O_{40}$, and $NH_4Mo_7O_{12}$ are preferably used. As is the case described above, as the compound containing an oxoanion ($MO_x^{n-}$) formed of a vanadium metal and oxygen bonded thereto, for example, $KVO_3$, $NaVO_3$, and $NH_4VO_3$ are preferably used. Among those mentioned above, in consideration of cost, molybdenum oxide or vanadium oxide is preferably used. In addition, compared to molybdenum oxide, vanadium oxide has a high toxicity, and hence, molybdenum oxide is more preferably used.

[Calcination]

In the manufacturing method of the present invention, when an aluminum compound as a precursor is calcined in the presence of a metal oxide, such as a molybdenum compound and/or a vanadium compound, polyhedral α-alumina particles each having a face other than the face [001] as the main crystal face, an approximately spherical shape, and a degree of α crystallization of approximately 100% can be formed. When this calcination is performed at a calcination temperature of more than 700° C., the precursor aluminum compound reacts with a molybdenum compound and/or a vanadium compound, and for example, aluminum molybdate ($Al_2(MoO_4)_2$) or aluminum vanadate ($AlVO_4$) may be formed. Furthermore, when the calcination temperature is 900° C. or more, for example, aluminum molybdate ($Al_2(MoO_4)_2$) or aluminum vanadate ($AlVO_4$) is decomposed, and a metal oxide, such as molybdenum oxide or vanadium oxide, formed thereby is selectively adsorbed to the face [113] of α-alumina and functions to efficiently suppress the development of the face [001].

As the amount of the aluminum compound and the amount of the metal compound, such as a molybdenum compound and/or a vanadium compound, to be used, since alumina having a high degree of α crystallization can be obtained, and approximately spherical particles can be efficiently obtained by suppressing the crystal growth of hexagonal bipyramidal shapes, a molar ratio of the metal in the metal compound to aluminum in the aluminum compound is preferably in a range of 0.03 to 3.0 and more preferably in a range of 0.08 to 0.7.

In addition, the state of the aluminum compound, which is a precursor, and the state of the metal compound in calcination are not particularly limited, and the metal compound may only be present at least in the same space as that for the aluminum compound so as to interact each other thereon. In particular, the two compounds may not be mixed with each other, may be mechanically mixed together by a simple mixing or pulverizing machine used for powder mixing, or may be mixed together using a mortar or the like. In addition, mixing may be performed in either a dry state or a wet state.

In addition, as for the calcination temperature, the maximum temperature may be set to not lower than a decomposition temperature of the metal compound, such as aluminum molybdate ($Al_2(MoO_4)_2$) or aluminum vanadate ($AlVO_4$), and in particular, may be set in a range of 900° C. to 1,300° C. In particular, in order to efficiently form alumina particles each having an approximately spherical shape and a degree of α crystallization of 90% or more or, specifically, 100%, calcination is more preferably performed at a maximum temperature of 950° C. to 1,100° C. and is most preferably performed at a maximum temperature in a range of 970° C. to 1,050° C.

As for the time for calcination, it is preferable that the increase in temperature to a predetermined maximum temperature be performed in a range of 1 to 10 hours, and that holding at the maximum temperature of calcination be performed for a holding time in a range of 5 minutes to 5 hours. In order to efficiently form α-alumina particles, a holding time is more preferably set to approximately 10 minutes to 3 hours.

The calcination atmosphere is not particularly limited, and for example, although calcination may be performed in an air or an oxygen atmosphere or in an inert atmosphere of nitrogen, argon, or the like, in consideration of cost, an air atmosphere is more preferable.

An apparatus used for calcination is not particularly limited, and a so-called calcination furnace may be used. The calcination furnace is preferably formed of a material which is not allowed to react with sublimated molybdenum oxide or vanadium oxide, and in order to efficiently use a metal oxide, such as molybdenum oxide and/or vanadium oxide, a highly airtight calcination furnace is preferably used.

[α-Alumina Particles]

The shape, the size, the specific surface area, and the like of α-alumina particles obtained by the manufacturing method of the present invention can be controlled by selecting the type and the content of each of the aluminum compound used as a precursor and the metal compound, such as a molybdenum compound and/or a vanadium compound, the calcination temperature, and the calcination time. Since the metal compound is used, the α-alumina of the present invention is α-alumina particles each having a crystal face other than the face [001] as the main crystal face and an approximately spherical polyhedral shape, and particles, main component particles of which each have a polyhedral shape having at least eight crystal faces, are preferably obtained. The case in which the face other than the face [001] functions as the main crystal face indicates that the area of the face [001] is 20% or less of the total area of the particle.

The shape of each of the α-alumina particles obtained by the present invention is a substantially approximately spherical polyhedral shape and has many fracture surfaces with respect to the primary particle, and the area of the largest flat surface is one eighth or less of the area of the particle. In particular, particles, in each of which the area of the largest flat surface is one sixteenth or less of the area of the particle, are preferably obtained. For example, when the calcination time is shortened, the sizes of flat surfaces of the particle are reduced, and as a result, α-alumina particles each having an approximately spherical polyhedral shape can be formed.

Although the size of each of the α-alumina particles obtained in the present invention is not particularly limited, for the filler application, the size is in a range of 0.2 to 100 μm, and, in particular, particles having a size in a range of 0.5 to 50 μm are preferably obtained. For example, when shapeless α-alumina having a small particle diameter (<200 nm) is used as a precursor, approximately spherical polyhedral α-alumina particles having a particle diameter of 500 nm or less can be formed. When γ-alumina is used as a precursor, as the specific surface area of the precursor or the content of the metal compound, such as a molybdenum compound and/or a vanadium compound, to be used is increased, the primary particle diameter size of the α-alumina particles to be obtained can be increased.

When the specific surface area of the aluminum compound used as a precursor and that of the α-alumina particles to be obtained are compared to each other, it is found that the specific surface area is remarkably decreased by the calcination. Although depending on the properties of the precursor aluminum compound and the calcination conditions, the specific surface area of the α-alumina to be obtained is in a range of 0.0001 to 50 $m^2/g$, and α-alumina having a specific surface area in a range of 0.001 to 10 $m^2/g$ is preferably obtained.

By the calcination at a high temperature, the metal compound, such as a molybdenum compound and/or a vanadium compound, which is used is mostly sublimated, and alumina particles containing α-alumina as the main component are formed. However, a metal compound, such as a molybdenum compound and/or a vanadium compound, which cannot be sublimated, may be contained in the form of a metal oxide, such as molybdenum oxide and/or vanadium oxide, in the obtained alumina particles in some cases. The content of the oxide is 10 percent by mass or less, and in particular, by sufficient calcination time and calcination temperature, the content described above can be decreased to 1 percent by mass or less.

The metal oxide, such as molybdenum oxide or vanadium oxide, contained in the α-alumina particles are present on the surfaces and/or the inner of the alumina particles. Those oxides may be removed by calcination at a higher temperature. In addition, the oxide present on the surfaces can be removed by washing with an aqueous ammonium solution or an aqueous sodium hydroxide solution.

Since being selectively adsorbed to the face [113] of α-alumina at a high temperature to efficiently suppress the development of the face [001], the metal oxide, such as molybdenum oxide and/or vanadium oxide, contributes to the formation of α-alumina having a crystal face other than the face [110] as the main crystal face, and the shape of the α-alumina particles thus obtained can be confirmed by SEM observation. Unlike plate-shaped α-alumina or polyhedral alumina having the face [001] as the main crystal face, each of which is obtained by a general method, the α-alumina particles obtained by a calcination treatment using a metal oxide, such as molybdenum oxide or vanadium oxide, as a catalyst are α-alumina particles each of which efficiently suppresses the [001] crystal face growth and has a uniform and approximately spherical polyhedral shape.

Since having the structure and the shape as described above, the α-alumina particles of the present invention can be preferably used as resin fillers. That is, plate-shaped α-alumina or approximately plate-shaped α-alumina in which the face [001] occupies a large area, each of which is obtained by a general method, is difficult to be filled in resin at a high filling rate. On the other hand, since having a degree of α crystallization of 90% or more or, specifically, 100% and an approximately spherical shape, the α-alumina particles of the present invention have a good filling property in resin and can be expected as a heat dissipation filler.

In the case described above, although the α-alumina particles of the present invention may be used as fillers without performing any additional treatments, for example, various surface treatments may also be performed so as not to degrade the advantages of the present invention.

EXAMPLES

Hereinafter, although the present invention will be described in more detail with reference to examples, the present invention is not limited thereto. In addition, unless otherwise particularly noted, "%" represents "percent by mass".

[Shape Analysis of α-Alumina Particles by Scanning Electron Microscope (SEM)]

A test sample was fixed to a sample support stage by a double stick tape and was then observed by a surface observation device VE-9800 manufactured by Keyence.

[Composition Analysis of α-Alumina by STEM-EDS]

A test sample formed along a cross-sectional direction was placed on a copper grid on which carbon was deposited, and a composition analysis of the sample was then performed by a high resolution electron microscope EM-002B, VOYAGER M3055 manufactured by Topcon/Norlan Instrument Co., Ltd.

[Analysis by X-Ray Diffraction (XRD) Method]

After a prepared test sample was placed on a measurement sample holder, and the holder was set in a wide angle X-ray diffraction apparatus (Rint-Ultima) manufactured by Rigaku Corp., measurement was performed using a Cu/Kα line, 40 kV/30 mA, a scanning rate of 1.0°/min, and a scanning range of 5° to 80°.

[Specific Surface Area Measurement of α-Alumina by BET]

The specific surface area was measured by a nitrogen gas adsorption/desorption method using a Trisstar 3000 type apparatus manufactured by Micromeritics. In addition, a pore size distribution was estimated using plots between a pore volume fraction and a pore size.

[Chemical Bond Evaluation of α-Alumina Structure by $^{27}$Al-NMR Measurement]

By the use of JNM-ECA600 manufactured by JEOL, solid $^{27}$Al single pulse non-decoupling CNMR measurement was performed. The chemical shift was determined by automatic reference setting of the apparatus.

[Composition Analysis of α-Alumina Particles by Fluorescence X-Ray]

After approximately 100 mg of a test sample was placed on filter paper, a PP film was placed thereon, and fluorescence X-ray measurement (ZSX100e/Rigaku Corp.) was performed.

[Calcination]

Calcination was performed using a ceramic electric furnace ARF-100K type calcination furnace apparatus provided with an AMF-2P type temperature controller, manufactured by Asahi Rika Manufacturing.

Example 1

Manufacturing of Polyhedral α-Alumina Particles from γ-Alumina

γ-alumina (active alumina having an average particle diameter of 45 μm and a BET specific surface area of 137 m$^2$/g, manufactured by Wako Pure Chemical Industries, Ltd.) in an amount of 8 g and molybdenum oxide (manufactured by Wako Pure Chemical Industries, Ltd.) in an amount of 2 g were mixed together using a mortar, so that 10 g of a mixture of precursor γ-aluminum and molybdenum oxide was obtained. The mixture thus obtained was calcined at 1,000° C. for 1 hour by an electric furnace. The molybdenum oxide was mostly sublimated, so that 7.6 g of a powder was obtained. By SEM observation, it was confirmed that the powder thus obtained was polyhedral particles each having a crystal face other than the face [001] as the main crystal face, a crystal face having an area larger than that of the face [001], and a particle diameter of 2 to 3 μm (FIG. 1).

Figure 2:
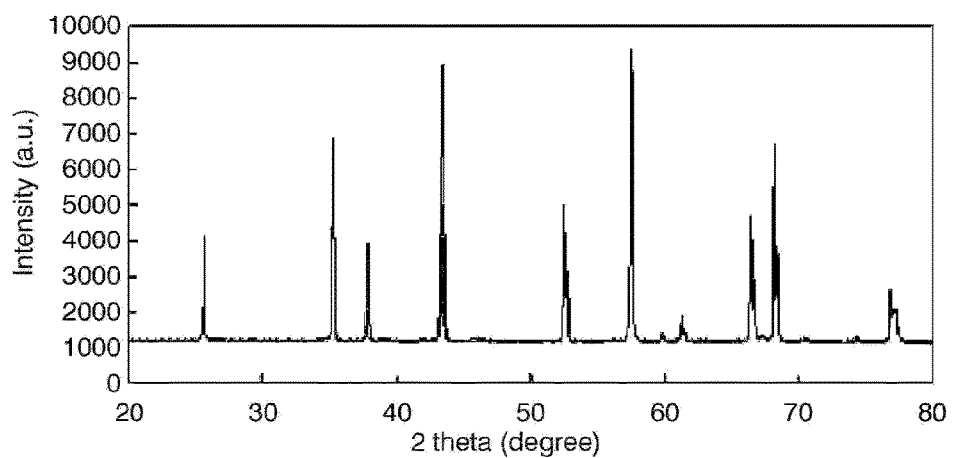
FIG. 2 is an XRD chart of the α-alumina particles obtained in Example 1.

By XRD measurement performed using the powder obtained as described above, sharp diffraction peaks derived from α-alumina appeared, and crystal system peaks other than the α crystal structure were not observed (FIG. 2). In addition, by solid $^{27}$Al NMR measurement, peaks derived from α-crystalline six-coordinate aluminum were observed only in a range of 15 to 19 ppm. Those results indicated that α-alumina having a degree of α crystallization of 100% was formed.

In addition, by the BET measurement, it was found that although the specific surface area of the precursor γ-aluminum was 137 m$^2$/g, the BET specific surface area of the powder obtained after the calcination was approximately 0.37 m$^2$/g. This indicated that the powder had a dense crystal structure.

In addition, analysis of molybdenum oxide remaining in the obtained powder was performed. By a STEM-EDS analysis, it was found that molybdenum oxide was simultaneously present on the surface and/or the inner of the α-alumina crystal. Furthermore, by a fluorescence X-ray quantitative evaluation data, it was confirmed that the amount of molybdenum oxide in the powder was 1.6 percent by mass.

Example 2

Manufacturing of Polyhedral α-Alumina Particles from γ-Alumina

Figure 3:
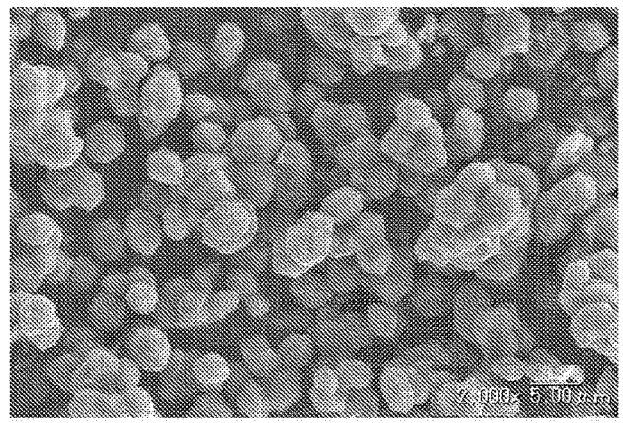
FIG. 3 is a scanning electron microscope photo of α-alumina particles obtained in Example 2.

The mixture of precursor γ-alumina and molybdenum oxide formed in Example 1 in an amount of 1 g was calcined at 1,000° C. for 5 minutes, so that 0.8 g of a powder was obtained as the yield. By SEM observation, it was confirmed that on the surface of the powder thus obtained, the number of well-developed flat crystal faces was very small, and that the powder thus obtained was polyhedral particles each having an approximately curved crystal face and a particle diameter of 2 to 5 μm (FIG. 3). Furthermore, by XRD measurement, it was confirmed that the degree of α crystallization was 100%.

Example 3

Figure 4:
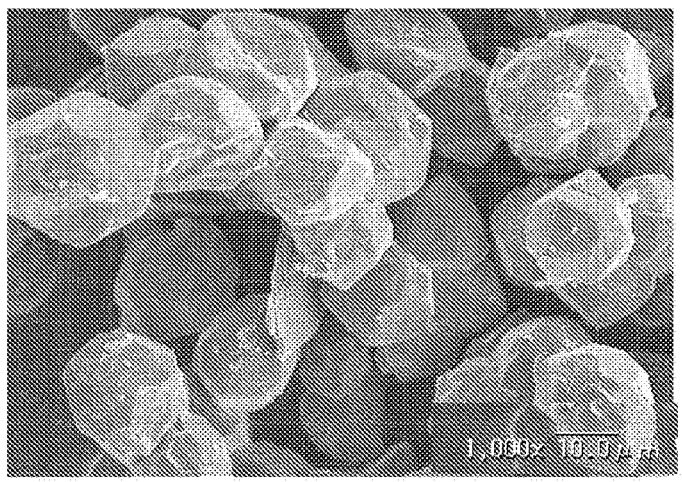
FIG. 4 is a scanning electron microscope photo of α-alumina particles obtained in Example 3.

Manufacturing of Polyhedral α-Alumina Particles from γ-Alumina

γ-alumina (having an average particle diameter of 40 to 70 μm and a BET specific surface area of 206 m$^2$/g, manufactured by STREM CHEMICALS) in an amount of 0.5 g and molybdenum oxide (manufactured by Wako Pure Chemical Industries, Ltd.) in an amount of 0.5 g were mixed together using a mortar. The mixture thus obtained was calcined at 1,000° C. for 1 hour, so that a powder was obtained. By SEM observation, it was confirmed that the powder thus obtained was polyhedral particles each having a crystal face other than the face [001] as the main crystal face, a crystal face having an area larger than that of the face [001], and a particle diameter of 20 to 23 μm (FIG. 4). Furthermore, by XRD measurement, it was confirmed that the degree of a crystallization was 100%.

Example 4

Removal of Molybdenum Oxide on Surface of α-Alumina

After the powder obtained in Example 1 in an amount of 0.2 g was dispersed in 5 mL of 10%-ammonium water, and this dispersion solution was stirred at room temperature (25° C. to 30° C.) for 3 hours, ammonium water was removed by filtration, followed by water washing and drying, so that 0.19 g of a powder was obtained. By XPS measurement of the powder thus obtained, molybdenum oxide was not detected on a sample surface. This indicated that by ammonium washing, molybdenum oxide present on the surface of each of the α-alumina particles was completely removed.

Example 5

Figure 5:
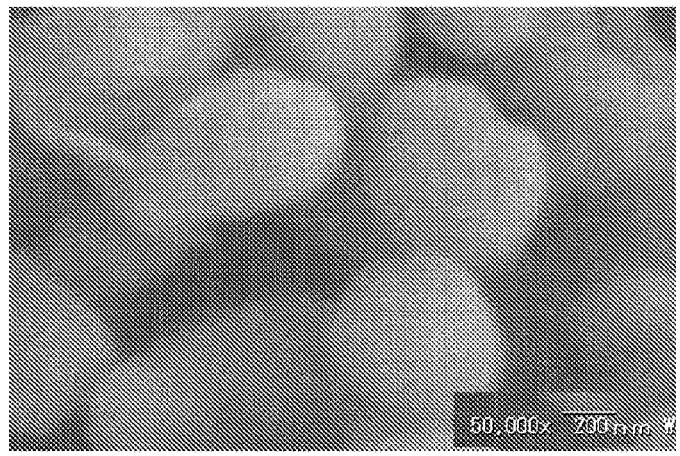
FIG. 5 is a scanning electron microscope photo of α-alumina particles obtained in Example 5.

Manufacturing of Polyhedral α-Alumina Particles from α-Alumina

α-alumina (having a primary particle diameter of 200 to 500 nm and a degree of α crystallization of 100%, manufactured by Wako Pure Chemical Industries, Ltd.) in an amount of 0.24 g and molybdenum oxide (manufactured by Wako Pure Chemical Industries, Ltd.) in an amount of 0.06 g were mixed together using a mortar. The mixture obtained thereby was calcined at 1,000° C. for 1 hour, so that a powder was obtained. By SEM observation, it was confirmed that primary particles of the powder thus obtained were approximately spherical polyhedral particles each having a particle diameter of 0.5 to 1 μm (FIG. 5), and by XRD measurement, α-alumina having a degree of α crystallization of 100% was confirmed.

Example 6

Manufacturing of Polyhedral α-Alumina Particles from Aluminum Hydroxide

Figure 6:
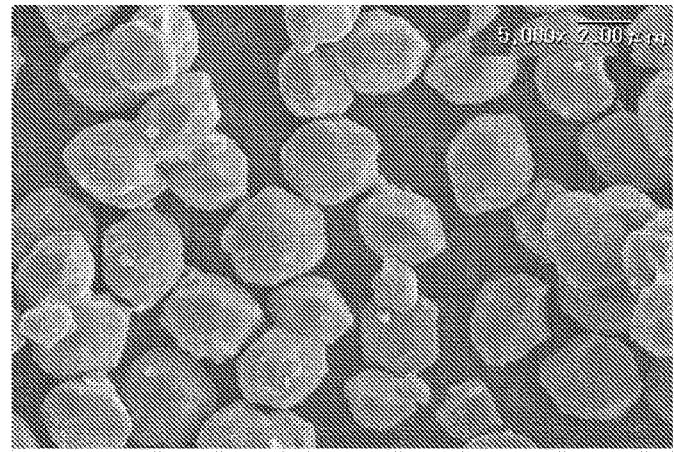
FIG. 6 is a scanning electron microscope photo of α-alumina particles obtained in Example 6.

Aluminum hydroxide (having an average particle diameter of 0.2 to 1.0 μm, manufactured by Wako Pure Chemical Industries, Ltd.) in an amount of 0.24 g and molybdenum oxide (manufactured by Wako Pure Chemical Industries, Ltd.) in an amount of 0.06 g were mixed together using a mortar. The mixture thus obtained was calcined at 1,000° C. for 1 hour, so that 0.16 g of a powder was obtained. By SEM observation, it was confirmed that the powder thus obtained was polyhedral particles each having a crystal face other than the face [001] as the main crystal face, a crystal face having an area larger than that of the face [001], and a particle diameter of 2 to 3 μm (FIG. 6). Furthermore, by XRD measurement, α-alumina having a degree of α crystallization of 100% was confirmed.

Example 7

Manufacturing of Polyhedral α-Alumina Particles from Aluminum Chloride

Figure 7:
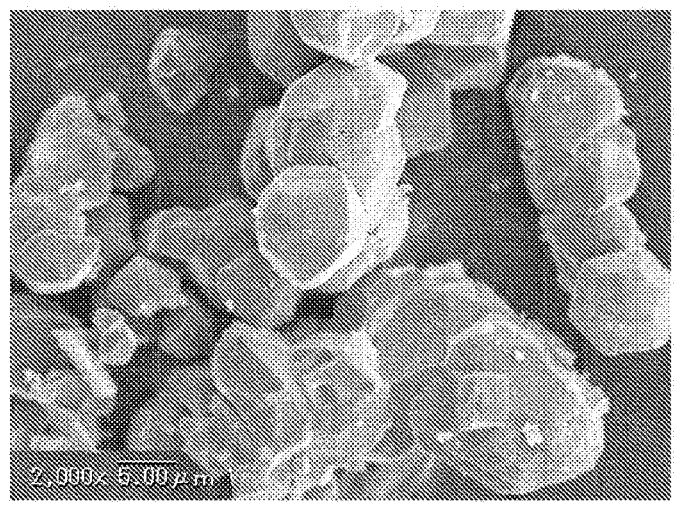
FIG. 7 is a scanning electron microscope photo of α-alumina particles obtained in Example 7.

Aluminum chloride (III) hexahydrate (manufactured by Wako Pure Chemical Industries, Ltd.) in an amount of 0.8 g and molybdenum oxide (manufactured by Wako Pure Chemical Industries, Ltd.) in an amount of 0.2 g were mixed together using a mortar. The mixture thus obtained was calcined at 1,000° C. for 1 hour, so that a powder was obtained. By SEM observation, it was confirmed that the powder thus obtained was polyhedral particles each having a crystal face other than the face [001] as the main crystal face, a crystal face having an area larger than that of the face [001], and a particle diameter of 2 to 10 μm (FIG. 7). Furthermore, by XRD measurement, α-alumina having a degree of α crystallization of 100% was confirmed.

Example 8

Manufacturing of Polyhedral α-Alumina Particles from γ-Alumina

Figure 8:
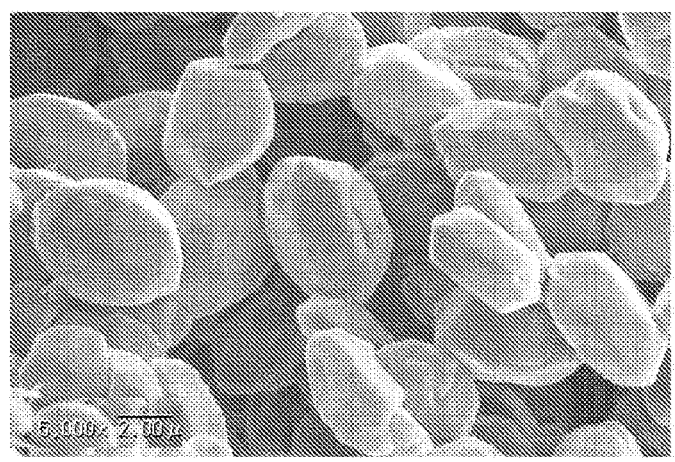
FIG. 8 is a scanning electron microscope photo of α-alumina particles obtained in Example 8.

After 0.1 g of molybdenum oxide (manufactured by Wako Pure Chemical Industries, Ltd.) was placed at the center of a lid of a crucible, 0.4 g of γ-alumina (active alumina having an average particle diameter of 45 μm and a BET specific surface area of 137 m$^2$/g, manufactured by Wako Pure Chemical Industries, Ltd.) was placed around the molybdenum oxide so as not to be in contact therewith. The crucible was then placed on the lid described above and was calcined at 1,000° C. for 1 hour in a state in which the lid and the crucible were arranged in a direction opposite to a normal direction. Molybdenum oxide was mostly sublimated, and 0.37 g of a powder was obtained. By SEM observation, it was confirmed that the powder thus obtained was polyhedral particles each having a crystal face other than the face [001] as the main crystal face, a crystal face having an area larger than that of the face [001], and a particle diameter of 2 to 6 μm (FIG. 8).

Comparative Example 1

Calcination of Only γ-Alumina

Figure 9:
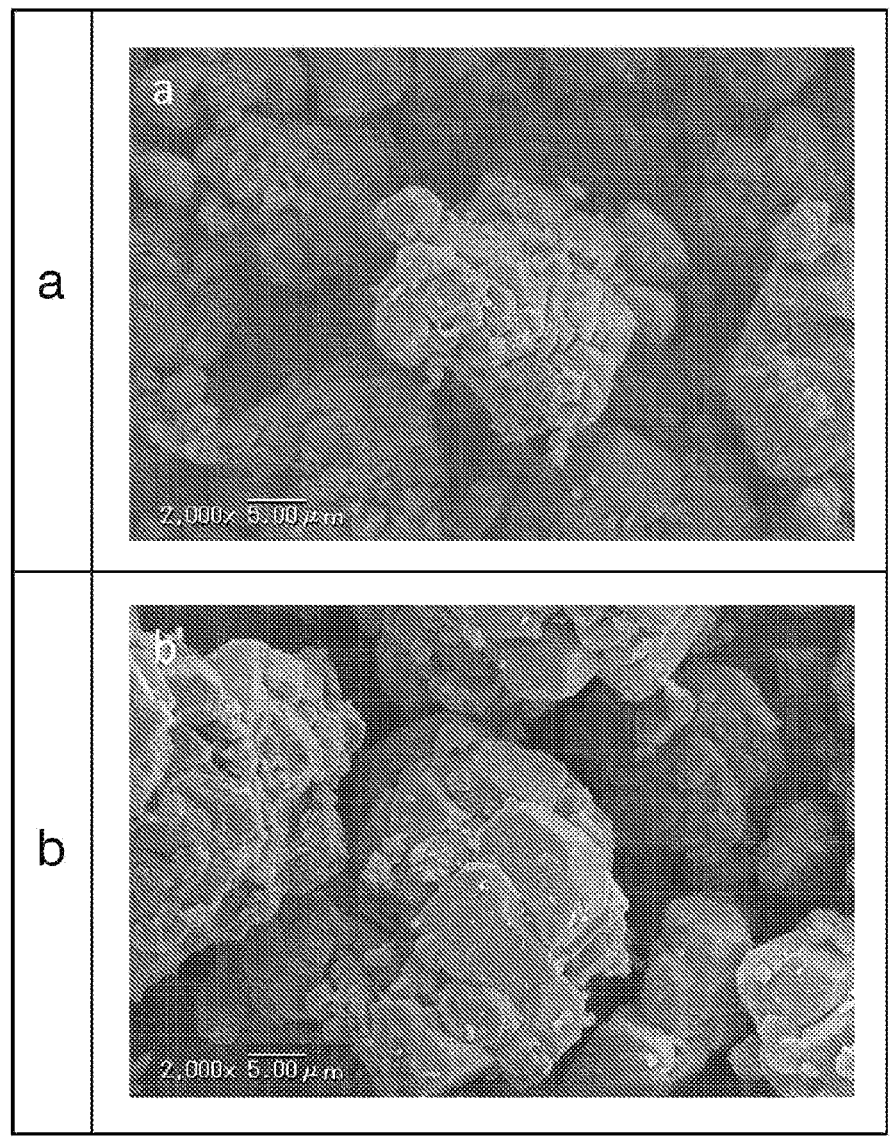
FIG. 9 includes a scanning electron microscope photo of γ-alumina (a) obtained in Comparative Example 1 and that of precursor γ-alumina (b).

By the use of 0.2 g of γ-alumina (active alumina having an average particle diameter of 45 μm and a BET specific surface area of 137 m$^2$/g, manufactured by Wako Pure Chemical Industries, Ltd.), calcination was performed under conditions similar to those of Example 1. By SEM observation, the change in shape of the powder obtained after the calcination (FIG. 9(a)) from that of the alumina before the calcination (FIG. 9(b)) was not detected. In addition, by XRD measurement, it was confirmed that the powder obtained after the calcination was γ crystal which is the same to that before the calcination. It was confirmed that since molybdenum oxide functioning as a catalyst was not present, polyhedral α-alumina particles each having a crystal face other than the face [001] as the main crystal face and an approximately spherical shape were not formed.

Example 9

Manufacturing of Polyhedral α-Alumina Particles from γ-Alumina

Ammonium molybdate tetrahydrate (manufactured by Wako Pure Chemical Industries, Ltd.) in an amount of 0.1 g and γ-alumina (active alumina having an average particle diameter of 45 μm and a BET specific surface area of 137 m$^2$/g, manufactured by Wako Pure Chemical Industries, Ltd.) in an amount of 0.4 g were mixed together using a mortar. The mixture thus obtained was calcined at 1,000° C. for 1 hour, so that a powder was obtained. By SEM observation, it was confirmed that the powder thus obtained was polyhedral particles each having a crystal face other than the face [001] as the main crystal face, a crystal face having an area larger than that of the face [001], and a particle diameter of 2 to 5 μm. Furthermore, by XRD measurement, α-alumina having a degree of α crystallization of 100% was confirmed.

Example 10

Manufacturing of Polyhedral α-Alumina Particles from γ-Alumina

γ-alumina (active alumina having an average particle diameter of 45 μm and a BET specific surface area of 137

$m^2/g$, manufactured by Wako Pure Chemical Industries, Ltd.) in an amount of 0.4 g and ammonium metavanadate in an amount of 0.1 g were mixed together using a mortar. The mixture thus obtained was calcined at 1,000° C. for 3 hour, so that 0.42 g of a powder was obtained. By SEM observation, it was confirmed that the powder thus obtained was approximately spherical polyhedral particles each having a crystal face other than the face [001] as the main crystal face, a crystal face having an area larger than that of the face [001], and a particle diameter of 1 to 3 μm. Furthermore, by XRD measurement, α-alumina having a degree of α crystallization of 100% was confirmed.

The invention claimed is:

1. α-alumina particles each having a particle diameter of 50 μm or less, a degree of α crystallization of 90% or more, a crystal face other than the face [001] as a main crystal face, and a polyhedral shape other than a hexagonal bipyramidal shape, wherein the α-alumina particles contain molybdenum oxide and/or vanadium oxide.

2. The α-alumina particles according to claim 1, wherein the α-alumina particles each have at least eight crystal faces.

3. The α-alumina particles according to claim 2, wherein the α-alumina particles contain 10 percent by mass or less of molybdenum oxide and/or vanadium oxide.

4. The α-alumina particles according to claim 2, wherein the area of the face [001] is 20% or less of the total area of each particle.

5. The α-alumina particles according to claim 3, wherein the area of the face [001] is 20% or less of the total area of each particle.

6. The α-alumina particles according to claim 1, wherein the α-alumina particles contain 10 percent by mass or less of molybdenum oxide and/or vanadium oxide.

7. The α-alumina particles according to claim 6, wherein the area of the face [001] is 20% or less of the total area of each particle.

8. The α-alumina particles according to claim 1, wherein the area of the face [001] is 20% or less of the total area of each particle.

9. A method for manufacturing polyhedral α-alumina particles, the method comprising: calcining an aluminum compound in the presence of a metal compound,
wherein aluminum in the aluminum compound and a metal in the metal compound are set so that a molar ratio of metal/aluminum is in a range of 0.03 to 3.0
wherein the calcination is performed in an air or an oxygen atmosphere or in an inert atmosphere of nitrogen or argon.

10. The method for manufacturing polyhedral α-alumina particles according to claim 9,
wherein the calcination is performed at a maximum temperature of 900° C. to 1,300° C., an increase in temperature to the maximum temperature is performed in a range of 1 to 10 hours, and holding at the maximum temperature is performed for a holding time in a range of 5 minutes to 5 hours.

11. The method for manufacturing α-alumina particles according to claim 10,
wherein the types of metals in the metal compound include molybdenum and/or vanadium.

12. The method for manufacturing α-alumina particles according to claim 9,
wherein the types of metals in the metal compound include molybdenum and/or vanadium.

* * * * *